US007787102B2

(12) United States Patent
Bornstein et al.

(10) Patent No.: US 7,787,102 B2
(45) Date of Patent: Aug. 31, 2010

(54) REAL-TIME CONFIGURABLE MASKING

(75) Inventors: William Bornstein, Stormville, NY (US); Anthony Cappa Spielberg, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 470 days.

(21) Appl. No.: 11/936,782

(22) Filed: Nov. 7, 2007

(65) Prior Publication Data
US 2008/0151208 A1 Jun. 26, 2008

Related U.S. Application Data

(62) Division of application No. 11/755,875, filed on Jan. 13, 2004, now Pat. No. 7,361,457.

(51) Int. Cl.
*G03B 27/42* (2006.01)
(52) U.S. Cl. .............................. 355/46; 355/53; 355/70; 355/77; 430/5; 430/394
(58) Field of Classification Search .............. 250/492.2, 250/492.22; 355/46, 53, 67, 70, 77; 359/855; 378/34–35; 430/5, 20, 30, 311, 322–324, 430/394
See application file for complete search history.

(56) References Cited

U.S. PATENT DOCUMENTS 6,611,316 B2 * 8/2003 Sewell ......................... 355/46
6,778,257 B2 * 8/2004 Bleeker et al. ................. 355/67
6,795,168 B2 * 9/2004 Wang et al. .................... 355/67
7,361,457 B2 * 4/2008 Bornstein et al. ............. 430/394
2004/0197672 A1 * 10/2004 Weed et al. ..................... 430/5
2009/0059197 A1 * 3/2009 Nam et al. ..................... 355/71

OTHER PUBLICATIONS

Neil Savage, A Revolutionary Chipmaking Technique?, News Analysis, IEEE Spectrum, Nov. 2003, p. 18.

* cited by examiner

*Primary Examiner*—Edward J Glick
*Assistant Examiner*—Colin Kreutzer
(74) *Attorney, Agent, or Firm*—Steven L. Bennett; Schubert Law Group PLLC

(57) ABSTRACT

Methods, systems, and media to define a portion of a circuit pattern with a source of real-time configurable imaging are disclosed. Embodiments include hardware and/or software for directing a beam through a mask onto a wafer surface to outline a circuit pattern having an undefined area, directing a second beam to the semiconductor wafer surface to define a circuit structure in the undefined area to complete the circuit pattern on the semiconductor wafer surface, and directing the second beam onto a source of real-time configurable imaging. Embodiments may also include a mask to include an undefined area incorporated into the circuit pattern to leave a critical structure of the circuit pattern undefined. Several embodiments include a photolithography system including an exposure tool, a mask, a source of real-time configurable imaging, and addressing circuitry.

14 Claims, 5 Drawing Sheets

REAL-TIME CONFIGURABLE MASKING

CROSS-REFERENCES TO RELATED APPLICATIONS

This application is a divisional application that claims benefit of the earlier filing date of U.S. patent application Ser. No. 11/755,875, entitled "REAL-TIME CONFIGURABLE MASKING", filed on Jan. 13, 2004 now U.S. Pat. No. 7,361,457.

FIELD OF INVENTION

The present invention is in the field of semiconductor fabrication. More particularly, the present invention relates to methods and arrangements to expose a semiconductor wafer surface to a circuit, pattern based upon a combination of a lithographic mask and a real-time configurable imaging system such as a digital light processing system, a Kerr cell system, and a Pockel cell system.

BACKGROUND

Lithography is arguably the most critical and costly set of operations in fabricating integrated circuits. Lithography is a process used to transfer a pattern from a mask or reticle to a layer of resist deposited on the surface of a wafer. A mask or reticle may be a square glass or quartz plate with a patterned metal film such as chrome on one side. Further, different variations of lithography utilize different wavelengths of radiation to expose the photoresist. In particular, photolithography (or optical lithography) may use UV radiation, X-ray lithography may use X-rays, e-beam lithography may use an electron beam, and ion beam lithography may use an ion beam. The exposure transfers the pattern from the mask to the wafer's surface by physically altering the photoresist.

Masks account for a large percentage of the cost of lithography. One semiconductor wafer may include many layers of circuitry, and a different mask may be used for each layer. For leading edge technologies, a mask set may cost $750,000. And, a large percentage of that money is spent controlling line widths. In particular, the industry drive toward smaller components has forced masks to include tiny, intricate details. In fact, the dimensions of the circuit patterns on the masks are so small that they are close to the wavelength of light used to expose the wafer's surface. Further, because, the dimensions of the circuit patterns and the wavelength of the light, a straight line printed on (or outlined by) the mask may not necessarily expose the wafer's surface to the straight line. The wafer's surface may be exposed to a line that is curved and rounded at the corners, creating a pattern in the photoresist that is slightly off and potentially causing a short or other defect in the resulting semiconductor circuit. Thus, an increasing number of error corrective techniques including, e.g., optical interference effects and diffraction effects, have been formulated to avoid such problems.

After such a large investment in capital, time, and effort to create masks, completed masks may still be discarded because a portion of the circuit pattern needs to be updated or changed after manufacturing the mask. To combat the costs of changing circuit patterns after a mask set is produced, various solutions have been employed to repair masks. However, the cost and cycle time associated with making repairs to a mask set are substantial and there are additional considerations to address with mask repair. For instance, a short in a circuit pattern created on a wafer may be discovered during testing of a first run in production of semiconductor circuits and, if the affected circuitry cannot be bypassed without impairing the functionality of the semiconductor circuit, the mask(s) may be removed from the production line for repair and the entire production line may be stopped until the mask(s) are repaired.

One solution is focused-ion beam (FIB) repair, which involves focusing a tight beam of ions on the mask to mill material away from a surface or deposit material on the surface. For example, to connect two unconnected, lines, an FIB can deposit a small amount of aluminum in a small stripe between the two lines on a wafer. Or, in another example, FIB may repair a mask by milling away a portion of chrome contamination off the surface of a mask. In yet another example, FIB may deposit a little bar of chrome on the mask.

Repairing the mask prevents repetition of the defect in all the semiconductor circuits and saves the cost of making an entirely new mask. However, FIB mask repair is limited to minor changes to a mask and is a "one-time only" technique. FIB requires that the mask be removed from the lithography equipment, inserted into the FIB system, repaired, cleaned, and replaced back into the lithography equipment. As a result, repairs are very time-consuming and additional repairs may significantly deteriorate the integrity of the circuit pattern on the mask.

Beyond the capital, time, and effort expended for reparations of masks that result from problems with a mask set, small differences between product lines of semiconductor circuits such as changes to a clock circuit to modify the frequency of operations in the semiconductor circuit may require the creation of additional mask sets. Some design decisions are preferably made at the time of manufacture of semiconductor circuits. For example, design decisions may include a decision about clock frequency for the circuit because design decisions for the clock frequency may be based upon the market, to which the product will be sold and current market conditions.

Therefore, there is a need for methods and arrangements capable of real-time changes in a circuit design of a mask.

SUMMARY OF THE INVENTION

The problems identified above are in large part addressed by methods and arrangements to define a portion of a semiconductor circuit pattern with a real-time configurable imaging system. One embodiment provides a photolithography mask to operate in conjunction with a digital micromirror device. The specially designed mask contemplates a circuit pattern including opaque and translucent areas to outline a layer of an integrated circuit; and an undefined area incorporated into the circuit pattern to leave a critical structure of the circuit pattern undefined, the critical structure being definable by the digital micromirror device by reflecting a supplemental exposure beam onto a semiconductor wafer surface to complete the circuit pattern.

Another embodiment provides a method to create an image on a semiconductor wafer surface. The method generally includes directing an exposure beam through a photolithography mask onto the semiconductor wafer surface to outline a circuit, pattern having an undefined area, positioning mirrors of a digital micromirror device to reflect a second exposure beam onto the semiconductor wafer surface to define a circuit structure in the undefined area to complete the circuit pattern on the semiconductor wafer surface, and directing the second exposure beam onto the digital micromirror device.

An additional embodiment provides a photolithography method. The method generally includes projecting a first exposure beam to a wafer surface, defining an optical path associated with an exposure tool, filtering the first exposure beam with a mask to project an incomplete circuit pattern onto the wafer surface, projecting a second exposure beam toward a digital micromirror device; and adjusting an array of micromechanical mirrors of the digital micromirror device to reflect a pattern of the second exposure beam into the optical path at the wafer surface, the array of micromechanical mirrors being capable of real-time, individual adjustment to reflect the pattern.

A further embodiment provides a photolithography system to facilitate definition of a portion of a semiconductor circuit pattern with real-time configurable imaging. The system contemplates an exposure tool to expose a wafer surface to a beam via a mask, wherein the mask filters the beam to project a circuit pattern, the circuit pattern comprising an undefined area designed for a circuit structure; a source of real-time configurable imaging to filter a second beam with a pattern defined by the circuit structure, to project the circuit structure onto a portion of the wafer surface that is associated with the undefined area; and addressing circuitry to configure the source of real-time configurable imaging with the pattern based upon the circuit structure.

BRIEF DESCRIPTION OF THE DRAWINGS

Other objects and advantages of the invention will become apparent upon reading the following detailed description and upon reference to the accompanying drawings in which, like references may indicate similar elements.

DETAILED DESCRIPTION OF EMBODIMENTS

Introduction

The following is a detailed description of embodiments of the invention depicted in the accompanying drawings. The embodiments are in such detail as to clearly communicate the invention. However, the amount of detail offered is not intended to limit the anticipated variations of embodiments, but on the contrary, the intention is to cover all modifications, equivalents, and alternatives falling within the spirit and scope of the, present invention as defined by the appended claims. The detailed descriptions below are designed to make such embodiments obvious to a person of ordinary skill in the art.

Generally speaking, methods and arrangements are contemplated to create an image on a semiconductor wafer surface that combines a design from a lithographic mask and a design from a source of real-time configurable imaging. One embodiment provides a photo lithographic mask describing a circuit pattern via opaque and translucent areas to filter a exposure beam. The mask also includes an undefined area or a simplified design of a critical structure of the circuit pattern left undefined. The undefined area on left on the wafer as a result of the undefined area can then be defined by a source of real-time configurable imaging. For example, a digital micromirror device, may reflect an exposure beam in the form of circuit structures to complete the circuit pattern defined by the mask. The digital micromirror device includes an array of micromechanical mirrors capable of being individually selected in real-time to reflect an incoming exposure beam in a given direction. Together, the circuit pattern from the photolithographic mask and the circuit structure(s) from the digital micromirror device expose the semiconductor wafer surface to a layer of a complete circuit pattern.

Design information, or circuit structure(s), defined by a source of real-time configurable imaging advantageously facilitates real-time changes to a circuit design up until and even during production. Additionally, the source of real-time configurable imaging can facilitate production of semiconductor circuits adjacent to one another on the same semiconductor wafer that are not identical. In some embodiments, for example, an array of Kerr cells or Pockel's cells may be implemented to filter an exposure beam with real-time design information based upon voltages applied that switch individual cells, on or off.

In many embodiments, hardware and/or software may implement addressing circuitry to define-patterns for circuit structures provided in real-time to, complete circuit designs The addressing circuitry may, for instance, receive a digital representation of circuit structure(s) to project on a wafer's surface and configure the source of real-time configurable imaging, such as the array of mirrors in a digital micromirror device or the opacity of cells in a Kerr cell system, to complete the circuit pattern provided by a mask.

DETAILED DESCRIPTION

Figure 1:
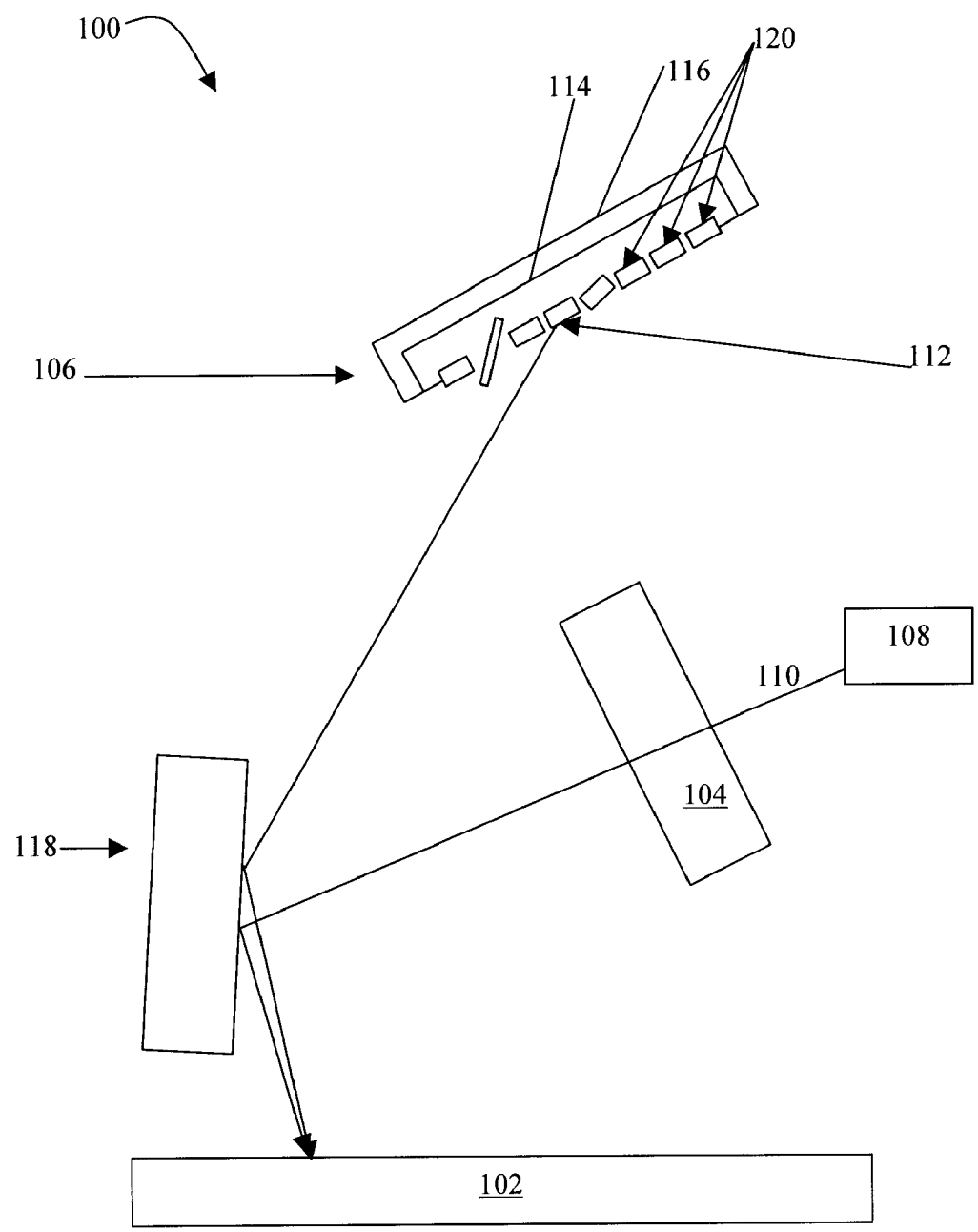
FIG. 1 depicts an embodiment of a system including a beam source, lithographic mask, light source, digital light processor, and semiconductor wafer surface to create an image on a semiconductor wafer surface.

Turning now to the drawings, FIG. 1 depicts an embodiment of a system to define a portion of a circuit pattern with a digital light processor (106). The system (100) creates an image on a semiconductor wafer surface (102) by combining a design on a lithographic mask (104) and a design in a source of real-time configurable imaging, which, in this embodiment, is digital light processor (106). To image the portion of the circuit pattern from the lithographic mask (104) onto the semiconductor wafer surface (102), system (100) includes an exposure tool (108). Exposure tool (108) may project an incoming beam (110), which may be light electrons, x-rays, or the like, through lithographic mask (104). Via the incoming beam (110), the lithographic mask (104), or a portion thereof, may be imaged directly on a mirror (118), and mirror (118) may scan that information across the semiconductor wafer surface (102). The semiconductor wafer surface, (102) may be silicon, silicon-germanium, gallium-arsenide, silicon-on-insulator, or other materials. In one embodiment, lithographic mask (104), is a photomask adapted for a critical area to be completed by digital light processor (106). A photomask refers to a mask used in photolithography to having chrome opaque areas to block resist exposure on a very high quality quartz plate that is otherwise transparent to UV radiation. Special designs of masks are further discussed with respect to FIGS. 2A-C.

To complete the circuit pattern being imaged onto the wafer surface, system (100) reflects design information from a digital light processor (106) to the semiconductor wafer surface (102) by including an incoming beam (112) and a digital light processor (106). The incoming beam (112) may be light, typically monochromatic light, for example, ultraviolet light; x-ray beam at a glancing angle; or the like. The digital light processor (106) uses reflective optics and typically includes a digital micromirror device (114) which includes an array of light-emitting, light-transmitting, or light-reflecting elements, which are individually addressable, usually with electronic signals from the control circuitry. One embodiment of digital micromirror device (114) has a rectangular array of up to 1.3 million hinge-mounted microscopic mirrors (120), each of these micromirrors (120) measuring less, than one-fifth the width of a human hair.

In one embodiment, the incoming beam (110) and the incoming beam (112) are generated by different sources. In another embodiment, the incoming beam (140) and the, incoming beam (112) are both projected from the source (108). The incoming beam (110) and the incoming beam (112) may concurrently draw different portions of the circuit pattern, and the portions may ultimately overlap, for example, in the case that the incoming beam (112) is being used to complete a connection that the incoming beam (110) has left open. In further embodiments, the beams (110, 112) may operate at separate times to transfer design information and supplementary design information in printing the semiconductor wafer surface. Being careful to ensure the two exposures are correctly aligned to each other and to the underlying layers, it is possible, for example, to apply a source of real-time configurable imaging and a conventional mask exposure at different times to complete a final circuit design.

To permit the mirrors (120) to tilt, each is attached to one or more hinges mounted on support posts and each is spaced by means of an air gap-over underlying addressing circuitry. The addressing circuitry (116) includes both hardware circuitry and software logic to produce, design, and adjust circuit design patterns. The addressing circuitry provides electrostatic forces, which cause each mirror (120) to selectively tilt individually in real-time to reflect the incoming beam (112) into the optical path. The optical path may refer to all devices involved in imaging a circuit design onto the semiconductor wafer surface (102). For example, in photolithography, the optical path may include the light sources (110, 112) and the optics to column and focus the light via mask (104) and the digital micromirror device (114) onto the wafer surface (102). The beam reflected from the digital light processor may add into the beam exiting, the lithographic mask (104) as another source to feed into the mirror (118). In another embodiment, the beam reflected from the digital micromirror device (114) may contact the semiconductor wafer surface at a separate time to create, a completed circuit design image in the resist. The digital light processor (106) redirects light to the portion of the wafer in the path of the undefined or simplified areas of the mask (104).

Figure 2:
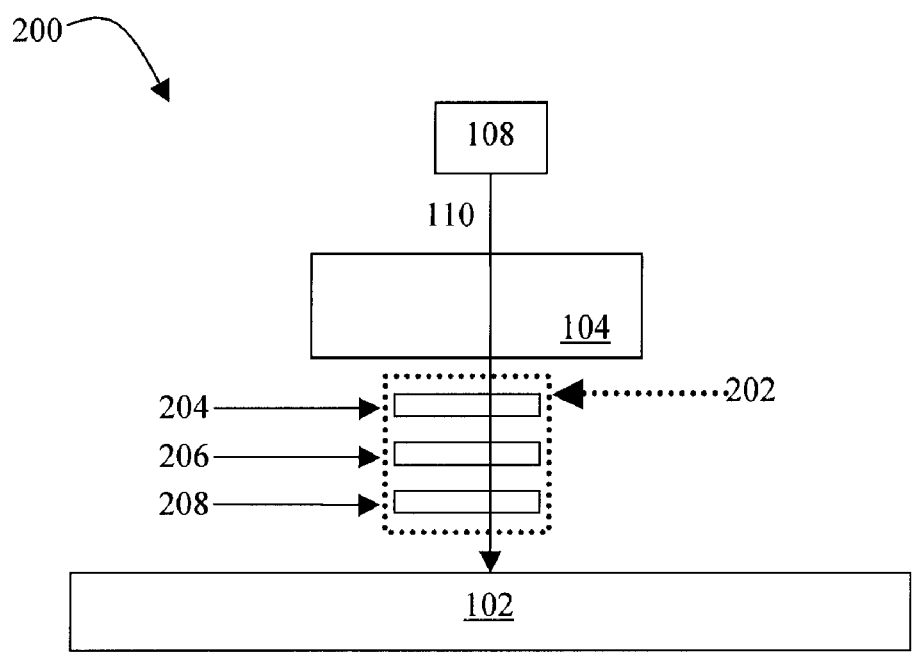
FIG. 2 depicts an embodiment of a system including a beam source, lithographic mask, light source, Kerr cell, and semiconductor wafer surface to create an image on a semiconductor wafer surface.

An alternate embodiment of system (100) may be system (200), which includes an alternate source of real-time configurable imaging, a Kerr cell system (202), in place of the digital light processor (106), and addressing circuitry to apply an electric potential to cells of the Kerr cell system (202) to complete a circuit pattern of mask (104). FIG. 2 depicts such an embodiment system (200). System (200) includes beam source (108), lithographic mask (104), Kerr cell system (202), and semiconductor wafer surface (102) to create an image on a semiconductor wafer surface (102) that combines a design on a lithographic mask (104) and a Kerr cell system (202).

A Kerr cell system (202) is a device whose light transmissibility is proportional to an applied voltage and typically depends, on modulating beams of light and polarization effects induced in a liquid. Light enters with incoming beam (110) first through vertical polarizer (204), which vertically polarizes the light. Next, the light passes through an electrically controlled retarder (206), which is typically a liquid-filled cell to function as an electrically controlled wave plate. Then, incoming beam (110) passes through a horizontal polarizer (208). Unless the light was changed by 90° in the retarder (206), it cannot pass through the second, horizontally-oriented polarizer (208). This arrangement, can open and close in $10^{-12}$ seconds, advantageously offering real-time configurability to the circuit structure(s) left undefined by the lithographic mask (104).

Further, the polarizers may be used to control the passage of light or its intensity. Accordingly, based upon the potential applied, the Kerr cell system (202) includes an optical medium that is adaptable in real-time to allow light, to pass into the optical path and fills in the undefined area(s) of the mask (104) to provide a circuit design on the semiconductor wafer surface (108), thereby completing a circuit pattern of the mask (104).

Instead of a Kerr cell system (202), system (200) may include an alternate source of real-time configurable imaging, a Pockel cell system. Pockel cells are based on the same electro-optical effect as Kerr cells, except with solid materials having birefringence properties. A birefringence substance is one that has two different indices of refraction. In Pockel cells, these indices of refraction are at right angles with respect to each other. The effect of birefringence is to change the polarization of the light's electric field vector as the light propagates through the material. In some special crystals, for example, potassium diphosphate, the crystal birefringence depends on the electrical field applied transversally to the crystal. Within a certain range, this relationship is linear. Thus, a Pockel cell is composed of several long aligned crystals and becomes a voltage-variable wave plate when an electrical field is applied perpendicularly to their longest dimension. This is a high voltage field, such as 250V. By modulating the electrical field, the birefringence of the cell is modulated. The number and geometrical arrangement of the crystals is intended to correct for parasitic birefringence caused by double refraction. In one embodiment, with the absence of electrical potential across the Pockel cell, the material is not birefringent and light will not pass through it. Thus, when an electric potential is applied, light passes to print a completing circuit pattern on the semiconductor wafer surface.

Figure 3:
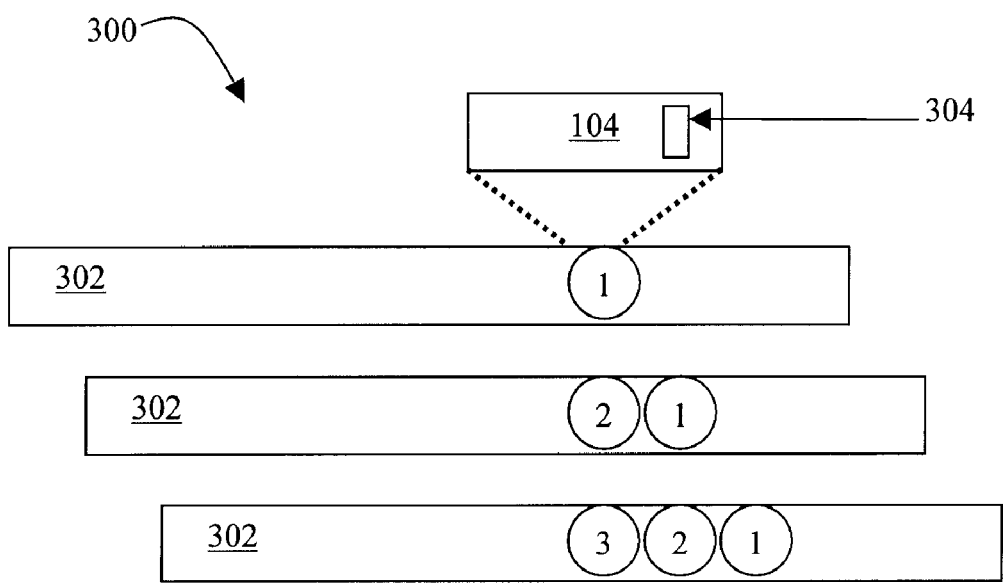
FIG. 3 depicts an embodiment of a system to print an image on a semiconductor wafer surface in stages.

Embodiments of system (100) or system (200) may operate in combination with a stepper (300) as in FIG. 3. FIG. 3 depicts an embodiment of the stepper (300) to print an image on a semiconductor wafer surface (302), which combines a design on a lithographic mask and a source of real-time configurable imaging. In contrast to full-field exposure tools, for example, stepper (300) exposes through the remotely located mask (104) only part of the wafer and repeats the process as many times as needed to expose the entire wafer (302). Typically, the semiconductor wafer (302) which is located on a stage (not shown) that moves the wafer (302) per exposure field. An exposure field may be printed independently of other exposure fields and may contain one chip or several chips. The lithographic mask (104) includes an undefined area (304) to be completed by a design from a source of real-time configurable imaging such as a digital light processor, Kerr cell, Pockel's cell, or the like. Through the use of mechanical systems, optical systems, or both, the information from the source of real-time configurable imaging can be used with a stepper (300) and operate in conjunction with stepper (300) to print circuit structures on the semiconductor wafer (302). Using a source of real-time configurable imaging is advantageous when used with a stepper because a completed circuit design imaged on a first-exposure field may be altered and unique from another completed circuit design imaged on the next exposure field.

In further embodiments, the stepper (300) may be a step-and-scan system, or a scanner that is able to increase throughput and resolution of smaller line-widths by carrying out the lithography operation while both mask and stage are moving. A slit moves across the mask as a stripe is printed through reflective optics, analogous to the light of a photocopier. Typically, the field is drawn continuously instead of printing the entire field at once. Through the use of mechanical systems, optical systems, or both, the information from the digital light processor, Kerr cell, Pockel's cell, or the like, can be used with a scanner and operate in conjunction with it to print a semiconductor wafer (302).

Figure 4A:
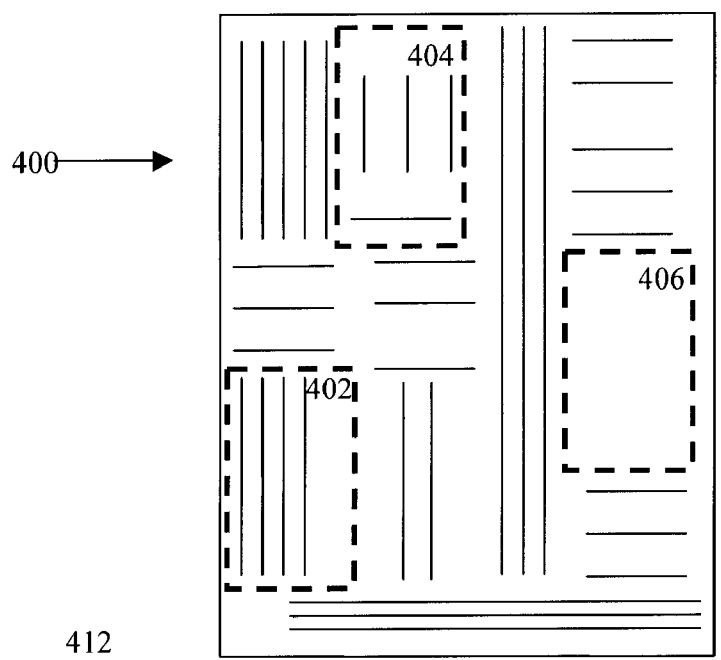
FIGS. 4A-C depict embodiments of a specially designed lithographic mask for use in conjunction with a source of real-time configurable imaging.
Figure 4B:
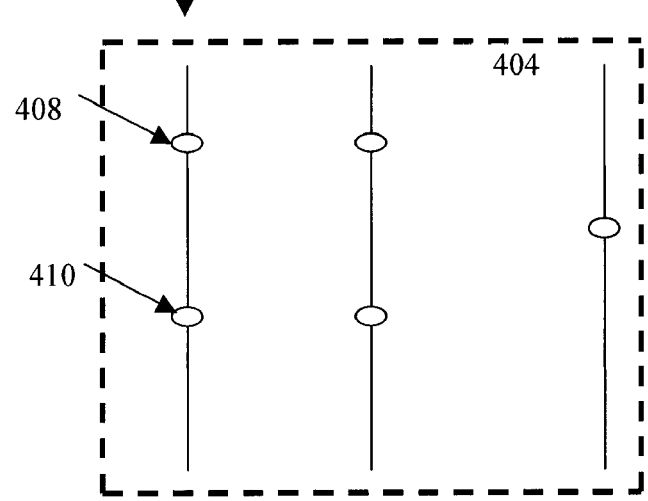
Figure 4C:
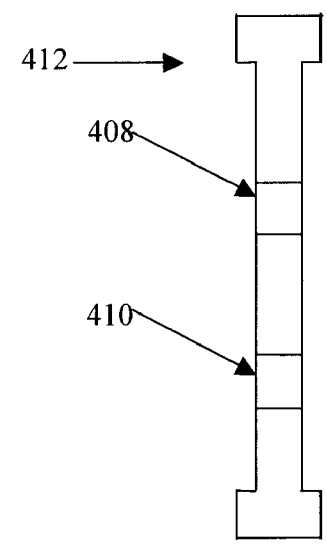

Turning to FIGS. 4A-C, FIG. 4A depicts an embodiment of a specially designed lithographic mask to define a portion of a semiconductor circuit pattern with a source of real-time configurable imaging. The lithographic mask (400) includes circuit patterns and undefined areas (402, 404, 406) that do not include a full circuit design. In this embodiment, the lithographic mask (400) includes both a partial circuit pattern (404) and an entirely undefined area (406). The circuit patterns that are deliberately left unfinished (402, 404, 406) are to be used in conjunction with a source of real-time configurable imaging to be imaged onto a semiconductor wafer surface. For example, FIG. 4B is an enlarged view of the partial circuit pattern (404), depicting regions that include missing links (408, 410). A source of real-time configurable imaging may then be implemented to make the design decision in real-time to turn missing links (408) or (410) on or off in FIG. 4C, at the time of manufacture, connecting or leaving unconnected the circuit patterns associated with the missing links (408, 410). In some situations, for example, turning on or off the missing links (408, 410) may include functionality in another layer of the wafer. In further embodiments, the source of real-time configurable imaging resolves whether to connect whole blocks of circuitry.

The strip (412), that includes region (408) and (410) also includes dog-boned ends for an Optical Proximity Correction (OPC) structure, which is a lithographic enhancement concept. These OPC structures are added to the circuit design and imaged on the mask (104) to correct for critical dimension and resolution variations that appear on wafers as these designs increase in density while concurrently decrease in feature size. The application of OPC to circuit designs is able to increase wafer yields. Embodiments are able to accommodate lithographic masks that include OPC.

The lithographic mask of FIGS. 4A-C may be any semiconductor fabrication mask adapted for a critical area to be completed by design information from a source of real-time configurable imaging. In one embodiment, the lithographic mask is a photomask, typically used in photolithography to block resist exposure in selected areas and consisting of chrome opaque areas supported by very high quality quartz plate transparent to ultraviolet radiation. Within photolithography, in other embodiments, the lithographic mask may be a phase shift mask to reduce destructive interference between light rays, printing near each other on a wafer by including semi-opaque areas to guide them out of phase. In further embodiments, the lithographic mask may be an X-ray mask, used in X-ray lithography, typically including gold as an opaque material patterned by e-beam lithography and supported by a thin membrane-made out of material transparent to X-rays of a given wavelength, for example silicon carbide.

Figure 5A:
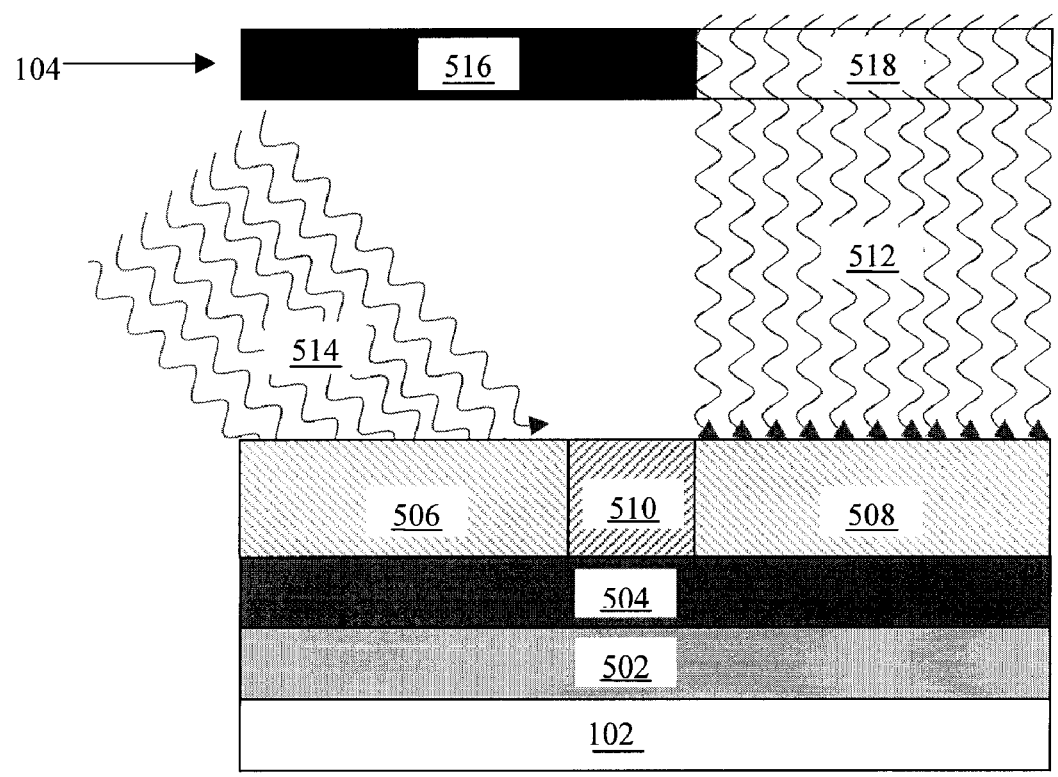
FIGS. 5A-B depicts embodiments of lithographic imaging including light, a lithographic mask, photoresist layer, polysilicon layer, oxide layer, semiconductor wafer, and light from a source of real-time configurable imaging.
Figure 5B:
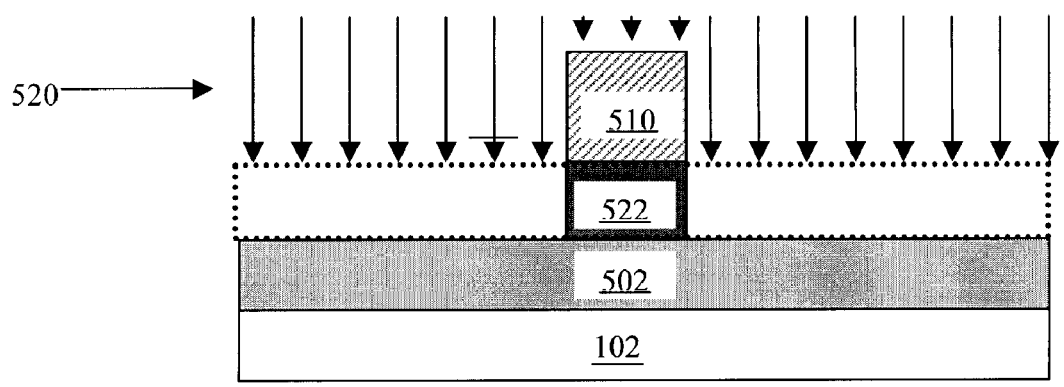

Turning to FIGS. 5A-B, FIG. 5A depicts an embodiment, of lithographic imaging using both a specially designed lithographic mask and a source of real-time configurable imaging. Using photoresist, a physical set of polygons on a mask and a source of real-time configurable imaging are translated into those same polygons in either conductive or insulating materials on a semiconductor wafer. FIG. 5A includes a cross section of a semiconductor wafer (102), on which an oxide film (502) has been grown in a high temperature furnace. This oxide film (502) has a purpose of preventing subsequent material from coupling capacitively with the semiconductor wafer (102). Next, the semiconductor wafer (102) has been put in a lower temperature furnace; gases reacted with the wafer surface and deposited a film, forming a blanket conductive polysilicon layer (504). Finally, the semiconductor wafer (102) has had a globule of photosensitive material, or resist, put on it and spun on a quickly rotating platform to get an essentially uniform, thin film of photosensitive material (506, 508, and 510) on the surface of the wafer. The photosensitive material (506, 508, and 510) includes a property that when it is exposed to light, it changes its polymerization and either becomes soluble or insoluble in the presence of certain chemicals.

The light (512) shines through the filtration of the mask (104), of which certain areas are opaque (516) while other areas are translucent (518) to light (512), to the photosensitive material (508). Analogous to the negative of a 35 mm camera, portions of the photosensitive material (508) are exposed and others (506, 510) are not exposed to the light (512). The photosensitive material (508) in this embodiment is a positive photoresist; thus, as the light (512) shines through the mask (104), the photosensitive material (508) remains on the wafer but it has been chemically changed in the areas where it has been exposed to light (512) into a physically different material. Light (514) also shines on the photosensitive material (506) from the source of real-time configurable imaging, in this example, to complete a segment of the circuit pattern of mask (104) to form gate electrodes on a transistor on a semiconductor wafer (102). The two areas of exposed photosensitive material (506, 508) are soluble and washed away. In other embodiments, the photosensitive material (508) may be a negative photoresist for which regions that are exposed to light become less soluble.

FIG. 5B illustrates that the unexposed photoresist (510) is a replicated pattern of design information from the lithographic mask (104) and source of real-time configurable imaging. Next, the wafer is introduced into a reactive ion etcher or an ion implanter shoots reactive ions (520) at the whole surface of the wafer (102). The unexposed photosensitive material (510) is used as a mask and shields part of the polysilicon layer (522) from implantation or from etching. The unexposed photosensitive material (510) can now be used as an etch stop material where reactive etching may remove material that is not protected by the photosensitive material (510). The reactive ions (520) mill away the polysilicon layer (504) to just the portion (522) protected by the unexposed photosensitive material (510). Finally, the unexposed photosensitive material (510) is ready to be stripped off or washed away. The consequence is that the design pattern that existed on the mask and source of real-time configurable imaging has been translated into films on the wafer. For example, a conductive layer only exists now where photosensitive material (510) protected it. So, a pattern was transferred from the mask into a single conductive layer on the wafer. In many embodiments, one pattern may be created in this conductive layer and a different pattern in an insulating layer on top of it, and a different pattern in a conducting layer on top of that layer. An arbitrary number of levels may exist. For example, twenty layers of conductors and insulators may exist, each interconnecting in a manner to facilitate replication of a circuit design with the semiconductor wafer (102).

Figure 6:
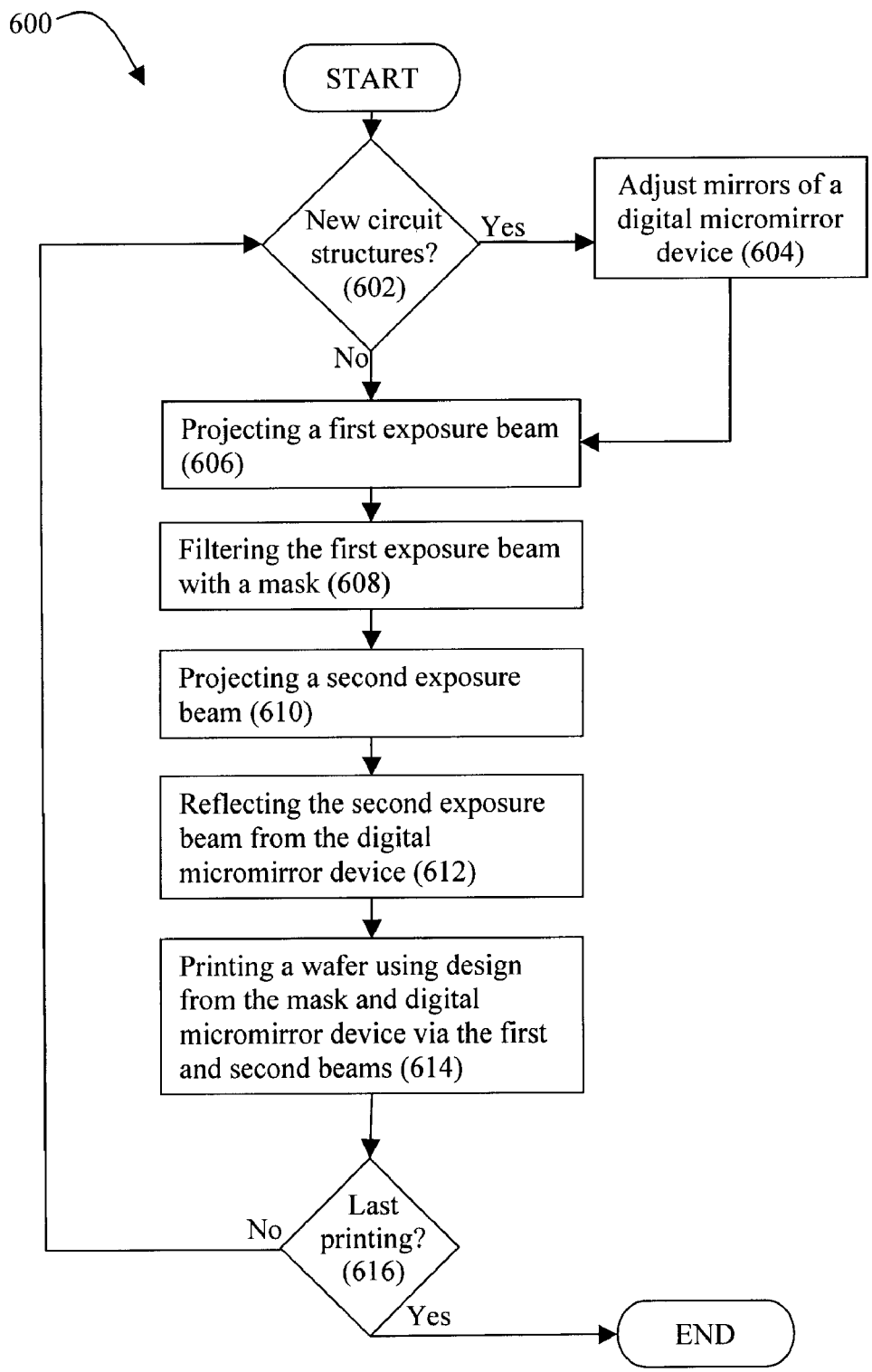
FIG. 6 depicts an example of a flowchart to project an image on a semiconductor wafer surface that combines a design from a lithographic mask and a design from a source of real-time configurable imaging.

Referring now to FIG. 6, there is shown an example of a flow chart (600) for a method to provide an image on a semiconductor wafer surface that, combines a design on a lithographic mask and a design from a source of real-time configurable imaging, which is a digital micromirror device in this embodiment. In other embodiments, the source of real-time configurable imaging may comprise a Kerr cell system, a Pockel cell system, or the like.

Flow chart (600) begins with (element 602), a decision block as to whether new or different circuit structure(s) will be printed to the semiconductor wafer, surface via the digital micromirror device. In some embodiments, different circuit structure(s) will not be chosen because the same circuit pattern may be repeated in multiple exposure fields of a stepper, for example. In other embodiments, different circuit structure (s) will be chosen, and mirrors of the digital micromirror device will be adjusted (element 604). In alternative embodiments, cells of a Kerr cell system or a Pockel cell system, for instance, may be adjusted to present a pattern of circuit structures with opaque and/or translucent cells.

After the circuit pattern selection has been established, a first exposure beam may be projected, of light, for example for use with replicating design patterns into photosensitive materials of photolithography.

The projected first exposure beam next is filtered by a lithographic mask in (element 608). In this embodiment, the lithographic mask is a photomask. A circuit patterned on the lithographic mask filters the first exposure beam as it passes through to the semiconductor wafer surface. The beam may pass through or be blocked by portions of the mask exposed to the beam. As the beam is filtered, it replicates the circuit pattern from the lithographic mask.

In addition, a second exposure beam is projected (element 610). In some embodiments, this second exposure beam is projected from the same exposure tool as the first exposure beam, for example, the same light source directed in two directions. In other embodiments, the second exposure beam is projected from a separate exposure tool, designated for the source of real-time configurable imaging. Typically, the second exposure beam is of the same type as the first exposure beam.

After the second exposure beam is projected, to complete the circuit design information being transferred by the first exposure beam through the lithographic mask, the second exposure beam is reflected from the digital micromirror device (element 612). The second exposure beam adds in parallel the supplementary circuit pattern design information from the digital micromirror device. Finally, the two beams print a semiconductor wafer surface, in one embodiment, a semiconductor wafer surface, incorporating design information from both the lithographic mask and the digital micromirror device (element 614).

After the circuit design is printed onto the semiconductor wafer surface, a decision is made as to whether another circuit design has yet to be printed (element 616) by modifying the circuit structure(s) imaged by the source of real-time configurable imaging. If this circuit design was not the last printing to be made, then it must be decided again whether the new circuit structure(s) is different, returning to (element 602) and so on.

One embodiment of the invention is implemented as a programmable product for use with a lithographic mask such as, for example, as shown in FIGS. 4A-C. The program(s) of the programmable product, defines functions of the embodiments (including the methods described herein) and can be contained on a variety of signal-bearing media. Illustrative signal-bearing media include, but are not limited to: (i) information permanently stored on non-writable storage media (e.g., read-only memory devices within a computer such as CD-ROM disks readable by a CD-ROM drive); (ii) alterable information stored on writable storage media (e.g., floppy disks within a diskette drive or hard-disk drive); and (iii) information conveyed to a computer by a communications medium, such as through a computer or telephone network, including wireless communications. The latter embodiment, specifically includes information downloaded from the Internet, and other networks. Such signal-bearing media, when carrying computer-readable instructions that direct the functions of the present invention, indicate embodiments of the present invention.

In general, the routines executed to implement the embodiments of the invention, may be part of an operating system or a specific application, component, program, module, object, or sequence of instructions. The computer program of the present invention typically is comprised of a multitude of instructions that will be translated by the native computer into a machine-readable format and hence executable instructions. Also, programs are comprised of variables and data structures that either reside locally to the program or are found in memory or on storage devices. In addition, various programs described hereinafter may be identified based upon the application for which they are implemented in a specific embodiment of the invention. However, it should be appreciated that any particular program nomenclature, that follows is used merely for convenience, and thus the invention should not be limited to use solely in any specific application identified and/or implied by such nomenclature.

It will be apparent to those skilled in the art having the benefit of this disclosure that the present invention contemplates methods and arrangements for real-time configurable masking. It is understood that the form of the invention shown and described in the detailed description and the drawings are to be taken merely as examples. It is intended that the following claims be interpreted broadly to embrace all the variations of the example embodiments disclosed.

What is claimed is:

1. A lithography system, comprising:
an exposure tool to expose a wafer surface to a first beam via a mask, wherein the mask filters the first beam to project a circuit pattern, the circuit pattern comprising an undefined area designed for a circuit structure to complete;
a source of real-time configurable imaging to filter a second beam with a pattern defined by the circuit structure, to project the circuit structure onto a portion of the wafer surface that is associated with the undefined area; and
addressing circuitry to configure the source of real-time configurable imaging with the pattern based upon the circuit structure.

2. The lithography system of claim 1, further comprising a second exposure tool to generate the second beam.

3. The lithography system of claim 1, wherein the source of real-time configurable imaging comprises an array of mirrors adaptable to reflect the second beam toward the wafer surface to create the circuit structure.

4. The lithography system of claim 1, wherein the circuit structure completes a critical circuit of the circuit pattern.

5. The lithography system of claim 1, wherein the source of real-time configurable imaging comprises an optical medium across which an electric potential is applied to create opaque and translucent areas to filter exposure of the wafer surface by the second beam, wherein the optical medium comprises an optical medium selected from an optical medium group comprising a liquid optical medium and a solid optical medium.

6. The lithography system of claim 1, wherein the exposure tool is to direct the beam onto the wafer surface prior to exposing the wafer surface via the second beam.

7. The lithography system of claim 1, wherein the exposure tool is to direct the first exposure beam onto the wafer surface during exposure of the wafer surface via the second exposure beam.

8. The lithography system of claim 1, wherein the source of real-time configurable imaging is to adjust the first and second portions of the second exposure beam to expose the wafer in conjunction with exposure of the wafer by the first exposure beam through the mask via a scanner.

9. The lithography system of claim 1, wherein the source of real-time configurable imaging is to adjust the first and second portions of the second exposure beam to expose the wafer in conjunction with exposure of the wafer by the first exposure beam through the mask via a step-and-scan system.

10. The lithography system of claim 1, wherein the source of real-time configurable imaging is to adjust the first and second portions of the second exposure beam between exposures of the wafer to define a distinct circuit structure in another undefined area of a different exposure field on the wafer.

11. The lithography system of claim 1, wherein the source of real-time configurable imaging is to adjust the first and second portions of the second exposure beam to connect circuits in the circuit pattern defined via exposure through the mask by the first exposure beam.

12. The lithography system of claim 1, wherein the addressing circuitry is to configure the source of real-time configurable imaging to adjust the first and second portions of the second exposure beam to disconnect circuits in the circuit pattern defined via exposure through the mask by the first exposure beam.

13. The lithography system of claim 1, wherein the addressing circuitry is to configure the source of real-time configurable imaging to adjust the first and second portions of the second exposure beam in response to a design decision at the time of manufacture to connect or disconnect missing links within the circuit pattern defined via exposure through the mask by the first exposure beam.

14. The lithography system of claim 1, wherein the addressing circuitry is to configure the source of real-time configurable imaging to adjust the first and second portions of the second exposure beam to connect or disconnect links for the circuit pattern defined via exposure through the mask by the first exposure beam, wherein the circuit pattern resides on another layer of the wafer.

* * * * *